United States Patent [19]

Masuda et al.

[11] Patent Number: 5,249,055
[45] Date of Patent: Sep. 28, 1993

[54] SOLID-STATE IMAGING APPARATUS INCLUDING EXTERNAL CHARGE INPUT TERMINAL

[75] Inventors: Takeshi Masuda; Kiyotaka Yashiro; Yoshio Tange; Yuji Miyachi, all of Tokyo; Tadashi Shiraishi, Itami, all of Japan

[73] Assignees: National Space Development Agency of Japan; Mitsubishi Denki Kabushiki Kaisha, both of Tokyo, Japan

[21] Appl. No.: 798,964

[22] Filed: Nov. 27, 1991

[30] Foreign Application Priority Data

Nov. 29, 1990 [JP] Japan .................................. 2-336257

[51] Int. Cl.$^5$ ........................................... H04N 5/335
[52] U.S. Cl. .......................... 358/213.28; 358/213.11; 358/213.23
[58] Field of Search ....................... 358/213.23, 213.26, 358/213.28, 213.11; 357/24 LR

[56] References Cited

U.S. PATENT DOCUMENTS

| | | | |
|---|---|---|---|
| 4,093,872 | 6/1978 | Hartman | 357/24 LR |
| 4,583,003 | 4/1986 | Kimata | 250/578 |
| 4,647,977 | 3/1987 | Tower | 358/213 |
| 4,788,592 | 11/1988 | Yamawaki et al. | 358/213.29 |
| 4,896,340 | 1/1990 | Caro | 377/60 |
| 5,063,449 | 11/1991 | Shibata et al. | 358/213.11 |

FOREIGN PATENT DOCUMENTS 54-8428 4/1979 Japan .
58-130564 8/1983 Japan .

Primary Examiner—Michael T. Razavi
Assistant Examiner—Tuan V. Ho
Attorney, Agent, or Firm—Leydig, Voit & Mayer

[57] ABSTRACT

A solid-state imaging device includes a plurality of light receiving elements, transfer gates for controlling reading-out of signal charges generated by the light receiving elements, a charge coupled device for transferring the signal charges from the light receiving elements through the transfer gates, a charge input electrode, and first and second electrodes for controlling the quantity of charges input from the charge input source. The first electrode contacts the charge input source. The second electrode contacts the first electrode and is connected to a light receiving element via a transfer gate or another charge coupled device. In this structure, the second electrode controls the quantity of input charges in response to a dc voltage in a charge input mode for testing the images and serves as a first stage transfer electrode in response to a clock pulse in a imaging mode for forming an image. Thus, the pitch of the light receiving elements is constant even at the charge input electrode.

6 Claims, 13 Drawing Sheets

SOLID-STATE IMAGING APPARATUS INCLUDING EXTERNAL CHARGE INPUT TERMINAL

FIELD OF THE INVENTION

The present invention relates to a solid-state imaging device and, more particularly, to a structure of a charge input means for a charge coupled device (hereinafter referred to as CCD).

BACKGROUND OF THE INVENTION

In linear image sensors, signal charges generated in a plurality of light receiving elements arranged in a one-dimensional array are read out by one CCD. Recently, needs for higher resolution have increased and the number of light receiving elements has increased. However, as the number of light receiving elements increases, the number of stages of CCDs increases, resulting in a deterioration in the overall transfer efficiency, the data rate, and the like. In order to solve these problems, a solid-state imaging device shown in FIG. 10, in which light receiving elements are divided in the middle and signal charges are read out by two CCDs arranged serially has been proposed.

In FIG. 10, a plurality of photodiodes (light receiving elements) 4 constituting a light-to-electricity conversion part are arranged in a line on a semiconductor substrate 3, and two CCDs 5 are arranged parallel to the photodiode array. Respective photodiodes 4 are connected to the charge transfer part of the CCD 5 via corresponding transfer gates 6 and signal charges stored in the photodiodes 4 are transferred to the CCD 5 by the ON operation of the transfer gates 6. In addition, output amplifiers 7 are provided at the ends of the CCDs 5 and signal charges transferred through the CCDs 5 are amplified in the output amplifiers 7 and output from the solid-state imaging element 1. A charge input means 2 is provided between the initial stages of the CCDs 5, whereby charges, other than the charges from the photodiodes, are injected into the CCDs 5 from outside. This charge input means 2 electrically supplies charges to the CCDs 5 at the a time other than during the imaging mode thereby to check and calibrate the CCDs 5 and the output amplifiers 7 or to test the respective transfer electrodes constituting the CCD 5.

FIG. 11 is a plan view showing the structure of the charge input means 2 in detail. In FIG. 11, reference numeral 10 designates a charge input terminal. Charge input controlling gates 8 and 9, which control the quantity of charges input from the charge input terminal 10, are provided at both sides of the charge input terminal 10. Reference numerals 11 and 12 designate transfer electrodes of the CCD 5.

Operation in the charge input mode will be described.

FIG. 12(a) is a diagram schematically showing a cross-section taken along a line C—C' of FIG. 11 and the corresponding potentials at times $t_1$ to $t_4$ in the charge input mode. FIG. 12(b) schematically shows waveforms of signals that are applied to the respective terminals.

Clock pulses I, $\phi 1$, and $\phi 2$ are applied to the charge input terminal 10, and signal input terminals of the transfer electrodes 11 and 12, respectively, and dc voltages $V_{GIL}$ and $V_{GIH}$ are applied to the signal input terminals of the charge input controlling gates 8 and 9, respectively.

First, at time $t_1$, the charge input terminal 10 and the transfer electrode 12 are at "H" level while the transfer electrode 11 is at "L" level.

At time $t_2$, the input signal I of the charge input terminal 10 becomes "L" level and charges are transferred from the charge input terminal 10 to the potential well beneath the input controlling gates 8 and 9. At time $t_3$, the charge input terminal 10 again becomes "H" level and the input charges $Q_0$ are stored in the potential well beneath the input controlling gate 9.

At time $t_4$, $\phi 1$ is at "H" level while $\phi 2$ is at "L" level. The transfer electrode 11 becomes "H" level and the transfer electrode 12 becomes "L" level, whereby measured charges $Q_0$ are transferred to the potential well beneath the CCD transfer electrode 11.

Next, operation in the imaging mode will be described.

FIG. 13(a) is a diagram schematically showing a cross-section taken along a line C—C' of FIG. 11 and the potential at times $t_1$ to $t_3$ in the imaging mode. FIG. 13(b) schematically shows waveforms of signals applied to the respective terminals.

Clock pulses $\phi 1$ and $\phi 2$ are applied to the signal input terminals of the transfer electrodes 11 and 12, respectively, and dc voltages $V_{GIL}$ and $V_{GIH}$ are applied to the signal input terminals of the charge input controlling gates 8 and 9, respectively.

Between times $t_1$ and $t_2$, the transfer gate (TG) 6 is opened and the signal charges $Q_1$ and $Q_2$ detected respectively in the light receiving elements 4-1 and 4-2 are transferred to the potential wells beneath the corresponding transfer electrodes 11.

At time $t_3$, the signal $\phi 1$ of the transfer electrode 11 is set to "H" level and the signal $\phi 2$ of the transfer electrode 12 is set to "L" level, whereby the signal charges $Q_1$ and $Q_2$ are transferred to the potential wells beneath the transfer electrodes 12 at the next stage. Thereafter, by repeating this operation, the signal charges are synchronized with the clock pulses and successively transferred.

Since the charge input part 2 of the prior art linear image sensor is constituted as described above, the pitch of the light receiving elements 4 in the charge transfer part 2 is unfavorably larger than that at another region.

More specifically, in a case where the width of the transfer electrodes 11 and 12 is 8 microns and the interval between the adjacent light receiving elements 4-1 and 4-2 (in FIG. 11, 11) is 16 microns, the interval between the light receiving elements 4-1 (in FIG. 11, 12) is required to be 31 microns when the width of the charge input terminal is 4 microns and the widths of the charge input controlling gates 8 and 9 are 3 microns and 4 microns, respectively.

When the spacing of the charge input part 2 is large and the array pitch of the light receiving element 4 corresponding to this part is large, resolution is significantly lowered at the charge input part 2, so that a uniform resolution over the chip cannot be obtained.

SUMMARY OF THE INVENTION

It is an object of the present invention to provide a solid-state imaging device having a charge input part provided at an initial stage of a CCD, in which the pitch of light receiving elements corresponding to the charge input part is equal to that at another region.

It is another object of the present invention to provide a solid-state imaging device having a charge input part at an initial stage of the CCD, in which the pitch of light receiving elements corresponding to the charge input part is equal to that at another region and the charge input part can be operated using a high precision bias supply in the charge input mode.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a solid-state imaging device includes a plurality of light receiving elements, transfer gates for controlling reading-out of signal charges generated by the light receiving elements, a charge coupled device for transferring the signal charges from the light receiving elements successively by the ON operation of the transfer gates, and a charge input means provided at the initial stage of the charge coupled device. This charge input means is constituted by a charge input source, and first and second electrodes for controlling the quantity of charges input from the charge input source. The first electrode of the charge input means is arranged in contact with the charge input source. The second electrode is arranged in contact with the first electrode and connected with a light receiving element via a transfer gate or another charge coupled device. In this structure, the second electrode serves as an electrode for controlling the quantity of input charges by applying a dc voltage thereto in the charge input mode and serves as a first stage transfer electrode by applying a clock pulse thereto in the imaging mode. Thus, operations in both modes can be performed without changing the array pitch of the light receiving elements at the charge input part.

According to a second aspect of the present invention, a solid-state imaging device includes a plurality of light receiving elements, transfer gates for controlling reading-out of signal charges generated in the light receiving elements, a charge coupled device for successively transferring signal charges in the light receiving elements in the ON operation of the transfer gates, and a charge input means provided at the initial stage of the charge coupled device. The charge input means includes a charge input source and first, second, and third electrodes for controlling the quantity of input charges from the charge input source. The first electrode is arranged in contact with the charge input source and the second electrode is arranged in contact with the first electrode. The third electrode is arranged in contact with the second electrode and connected to the light receiving element via the transfer gate or another charge coupled device. In this structure, by applying a clock pulse to the third electrode continually, the third electrode serves as an electrode for transferring measured charges in the charge input mode and as an initial stage transfer electrode during the operation mode. Thus, operations in both modes can be performed without changing the pitch of the light receiving elements at the charge input part. In addition, a high performance bias supply can be used for the first and second electrodes in the charge input mode.

DETAILED DESCRIPTION OF THE PREFERRED EMBODIMENTS

Embodiments of the present invention will be described in detail with reference to the drawings.

Figure 1:
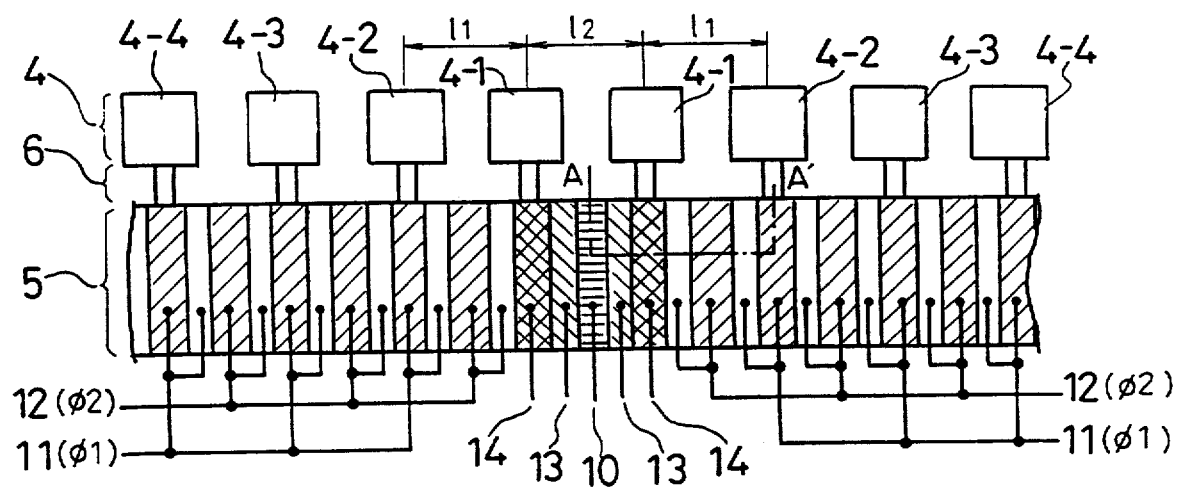

FIG. 1 is a plan view schematically showing a structure of a solid-state imaging device in accordance with a first embodiment of the present invention, in which a charge input means is provided in the center of the structure and two CCDs are serially arranged with the charge input means therebetween. In FIG. 1, a light-to-electricity conversion part 4 includes a plurality of light receiving elements 4-1, 4-2, 4-3, 4-4 .... Signal charges generated by the light-to-electricity conversion part 4 are transferred to the CCDs 5 via the transfer gates 6 by the switching of the transfer gates 6 to ON. Reference numerals 11 and 12 designate transfer electrodes of the CCDs 5 and numerals $\phi 1$ and $\phi 2$ are input signals applied to the transfer gates 11 and 12. Reference numeral 10 designates an electrode input terminal for electrically injecting charges into the CCDs 5 from outside. First charge input controlling gates 13 are provided in contact with the charge input terminal 10 and control the charges input from the charge input terminal 10. Common gates 14 are provided in contact with the first charge input controlling gates 13 and serve both as second charge input controlling gates and initial stage transfer electrodes. The common gates 14 serve as the second input controlling gates in the charge input mode and as the transfer gates like the transfer electrodes 11 in the imaging mode.

Operation in the charge input mode will be described hereinafter.

As described above, in the charge input mode, the common gates 14 serve as the second charge input controlling gates with the first charge input controlling gates 13 and function in the same way as the charge input controlling gates 8 and 9 of the prior art device.

Figure 1A:
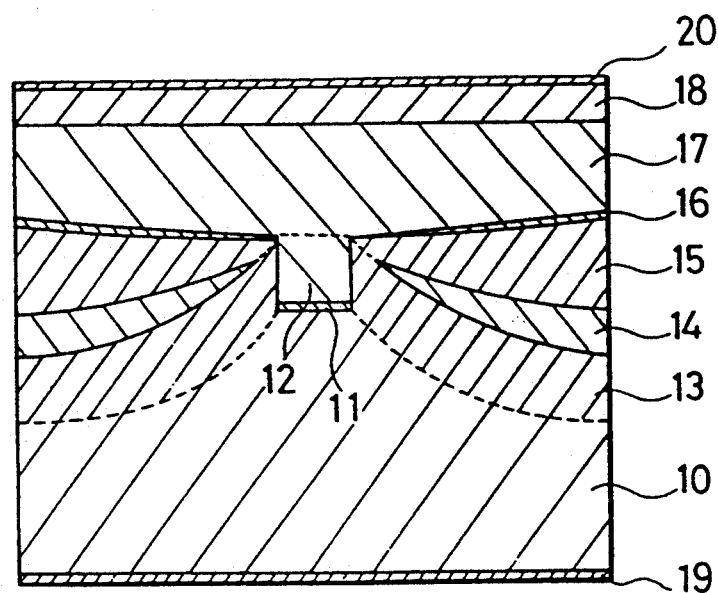
FIG. 1 is a plan view showing an input part of a one-dimensional solid-state imaging device in accordance with a first embodiment of the present invention.
Figure 1B:
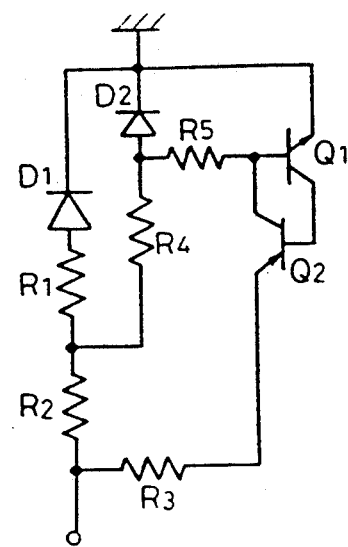
Figure 2A:
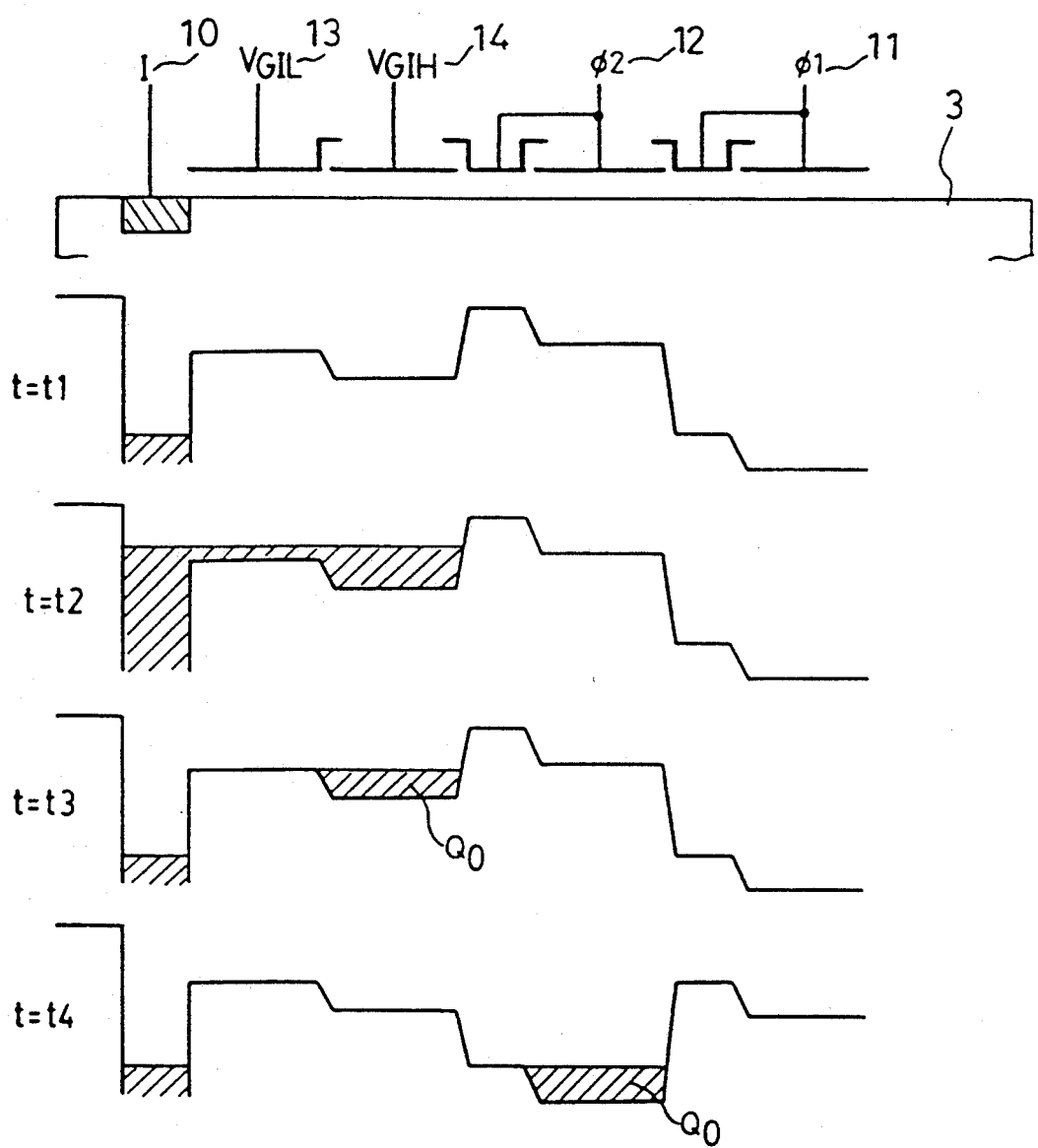
FIG. 2(a) is a diagram showing a cross-section taken along a line A—A' of FIG. 1 and potential in the charge input mode and FIG. 2(b) is a diagram schematically showing waveforms of signals applied to the respective terminals.
Figure 2B:
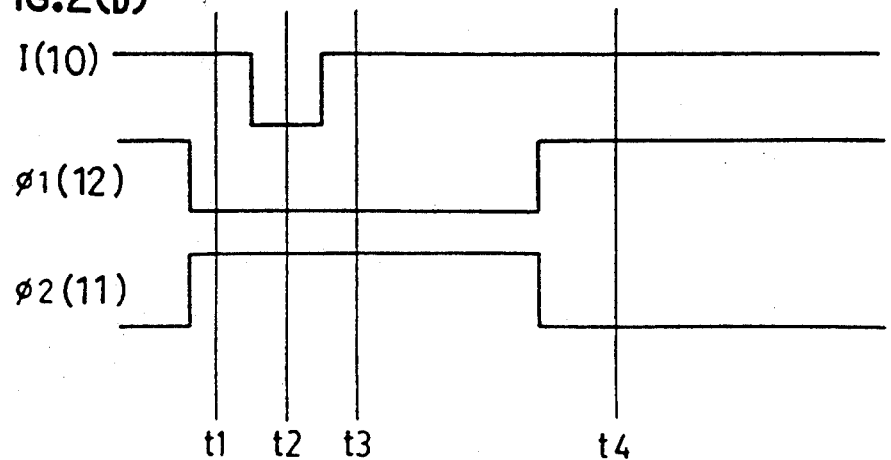

FIG. 2(a) shows a cross-section taken along a line A—A' of FIG. 1 and the potentials at times $t_1$ to $t_4$. FIG. 2(b) schematically shows waveforms of signals applied to the respective terminals.

Clock pulses I, $\phi 1$ and $\phi 2$ are applied to the charge input terminal 10 and the transfer electrodes 11 and 12, respectively, while dc voltages $V_{GIL}$ and $V_{GIH}$ are applied to the first charge input controlling gate 13 and the common gate 14, respectively. The quantity of the input charge is measured by the difference in voltages applied to the gates 13 and 14 and controlled to be a desired value.

Between times $t_1$ and $t_2$, charges are transferred from the charge input terminal 10 to the potential well beneath the input controlling gate 13 and the common gate 14. At time $t_3$, the charge input terminal 10 becomes "H" level again and the measured input charges $Q_0$ are stored in the potential well beneath the common gate 14.

At time $t_4$, the transfer electrode 12 becomes "H" level and the charges $Q_0$ are transferred to the potential well beneath the CCD transfer electrode 12.

Thus, the charge input operation can be performed in the same way as the prior art device.

Operation in the imaging mode will be described hereinafter.

Figure 3A:
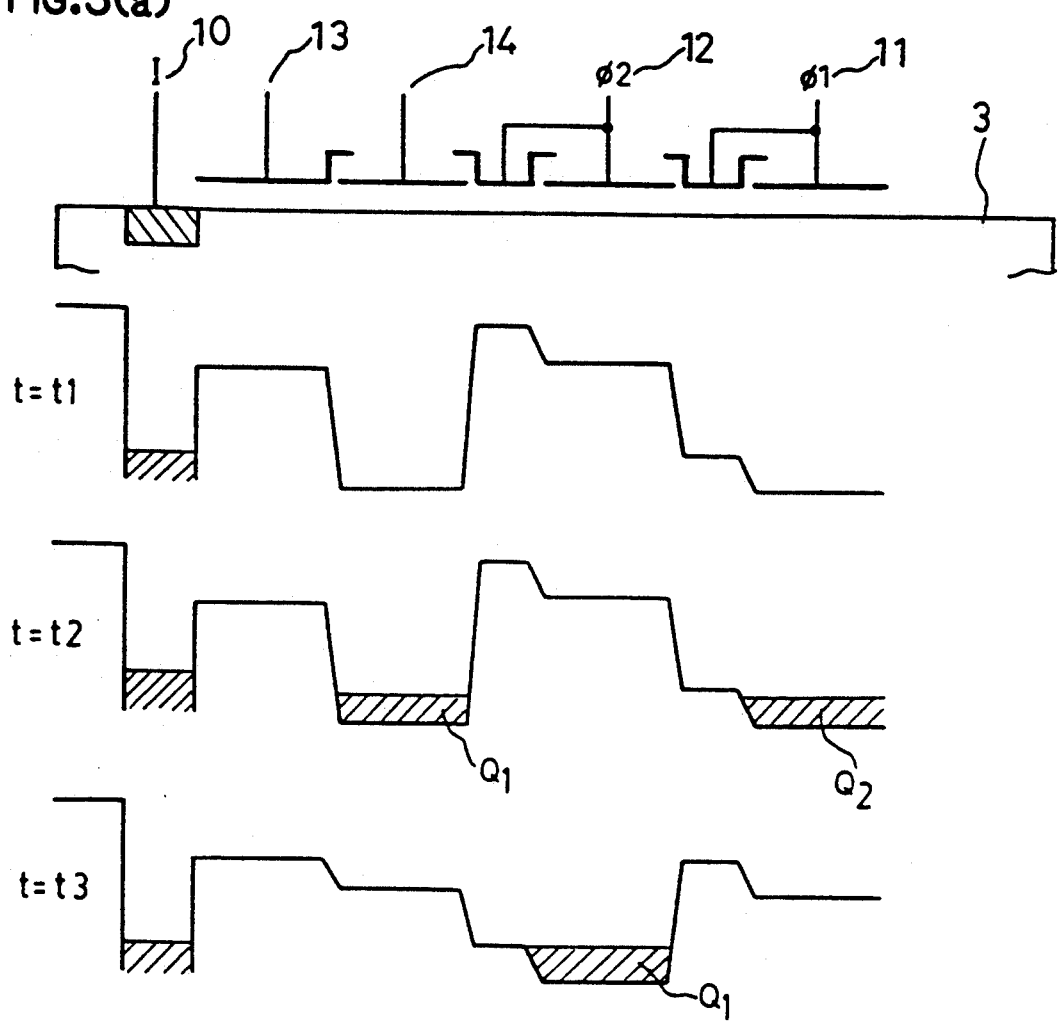
FIG. 3(a) is a diagram showing a cross-section taken along a line A—A' of FIG. 1 and potentials in the imaging mode and FIG. 3(b) is a diagram schematically showing waveforms of signals applied to the respective terminals.
Figure 3B:
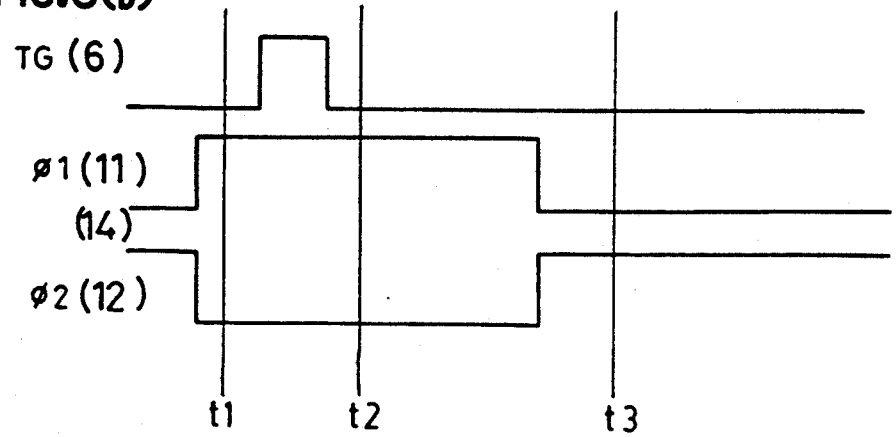

FIG. 3(a) shows a cross-section taken along a line A— A' of FIG. 1 and the potentials at times $t_1$ to $t_3$. FIG. 3(b) schematically shows waveforms of signals applied to the respective terminals.

A clock pulse having the same phase as that applied to the transfer electrode 11 is applied to the common gate 14 and a dc voltage is applied to the charge input controlling gate 13.

Between times $t_1$ and $t_2$, the transfer gate TG 12 is opened and signal charges $Q_1$ and $Q_2$ stored in the light receiving elements 4-1 and 4-2, respectively, are transferred to the potential wells beneath the common electrode 14 and the transfer electrode 11, respectively. Thereafter, the transfer electrode 11 and the common electrode 14 are set to "L" level and the transfer electrode 12 is set to "H" level by applying clock pulses and then the signal charges $Q_1$ beneath the common electrode 14 are transferred to the potential well beneath the transfer electrode 12 and the charges $Q_2$ beneath the transfer electrode 11 are transferred to the potential well beneath the next stage transfer electrode. In this way, signal charges are successively transferred synchronously with the clock pulses as in the prior art image sensor.

In this first embodiment of the present invention, since the electrode 14 serves both as the second electrode for controlling the quantity of input charge and the initial stage transfer electrode for transferring signal charges, the pitch of the light receiving elements at the charge input part is as follows.

In a case where the width of the transfer gates 11 and 12 is 8 microns and the interval $l_1$ between adjacent light receiving elements, other than those at the charge input part, is 16 microns, like the prior art device, by making the width of the charge input terminal 10 4 microns and the widths of the charge input controlling gate 13 and the common gate 14 3.5 microns and 5 microns, respectively, the interval $l_2$ between the light receiving elements 4-1 at the charge input part 2 can also be 16 microns.

Accordingly, in this first embodiment, the area of the charge input part 2 can be reduced without changing the scale of the electrode input terminal and the charge input controlling gate, and the pitch of the light receiving elements corresponding to the charge input part can be equal to the pitch of the light receiving elements in the other parts of the imaging devices.

As described above, according to the first embodiment of the present invention, the charge input controlling electrode and the transfer electrode are the same electrode 14. A dc voltage is applied to the electrode 14 at the time of charge input mode so that it may serve as the second charge input controlling electrode and a clock pulse is applied thereto in the time of imaging mode so that it serves as the transfer electrode. Therefore, the area of the charge input part 2 can be reduced and the pitch of the light receiving elements corresponding to the charge input part is equal to the pitch of the light receiving elements corresponding to the other parts of the imaging device whereby the pattern design can be simplified. In addition, no reduction in resolution occurs at the charge input part and uniform resolution can be obtained in the chip.

While in the above first embodiment a one-dimensional solid-state imaging device is described, the present invention can be also applied to a two-dimensional solid-state imaging device.

Figure 4A:
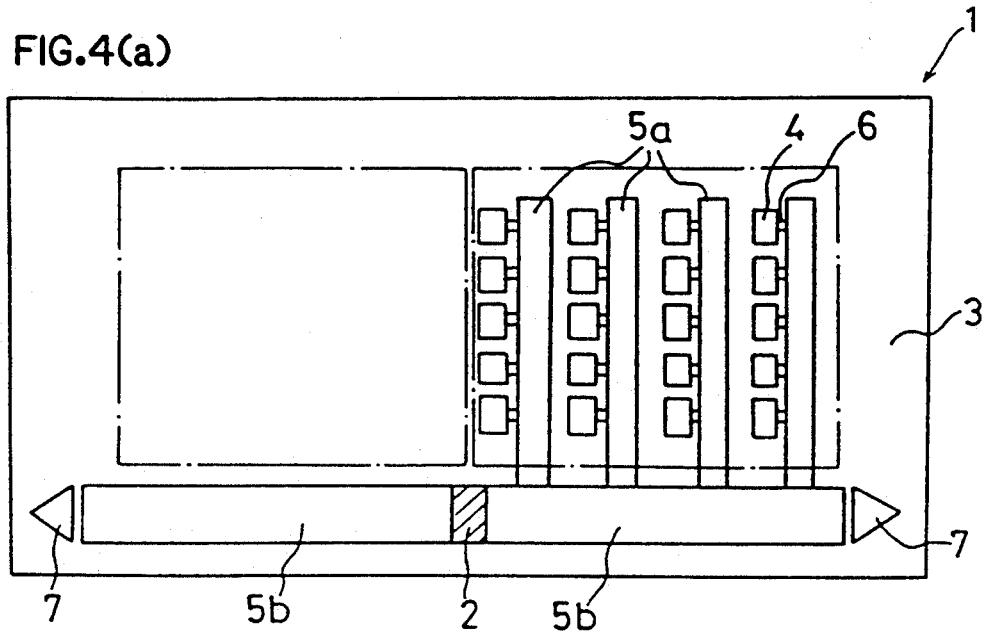
FIGS. 4(a) and 4(b) are plan views showing an input part of a two-dimensional solid-state imaging device in accordance with the first embodiment of the present invention.
Figure 4B:
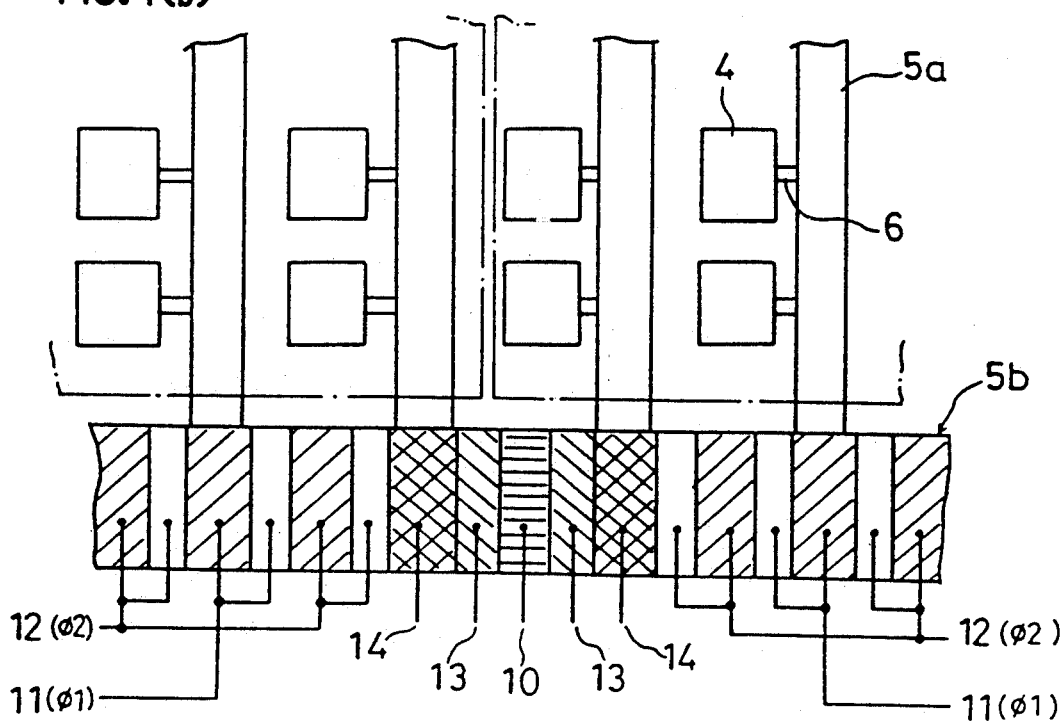

FIG. 4(a) is a plan view showing a two-dimensional solid-state imaging device in which the charge input part 2 of the first embodiment is applied to a horizontal CCD, and FIG. 4(b) is a plan view showing the charge input part 2 and its vicinity in detail. In these figures, the same reference numbers as those shown in FIG. 1 designate the same parts, and reference numerals 5a and 5b designate vertical CCDs and horizontal CCDs, respectively. The structure of the charge input part 2 is similar to that shown in FIG. 1 according to the first embodiment except that the common gates 14 are connected with the output terminals of the vertical CCDs 5a.

In this structure, the two-dimensional solid-state imaging device is divided in the middle and signal charges generated in the light receiving elements 4 are transferred by the vertical CCDs 5a through the transfer gates 6. Signal charges transferred from the vertical CCDs 5a are read out simultaneously by the two horizontal CCDs 5b.

Also in this structure, the common gates 14 are provided in the charge input part 2 between the horizontal CCDs 5b, and a dc voltage is applied to the common gates 14 in the charge input mode so that they may serve as charge input controlling gates and a clock pulse synchronized with the transfer electrode 11 is applied thereto in the imaging mode so that they may serve as transfer electrodes of the CCDs 5. Thus, as the first embodiment, the area of the charge input part 2 is reduced and the pitch of the light receiving elements corresponding to this part is equal to the pitch of light receiving elements corresponding to the transfer electrode parts. As a result, a reduction in resolution, which is caused by the provision of the charge input part, is prevented.

Figure 5:
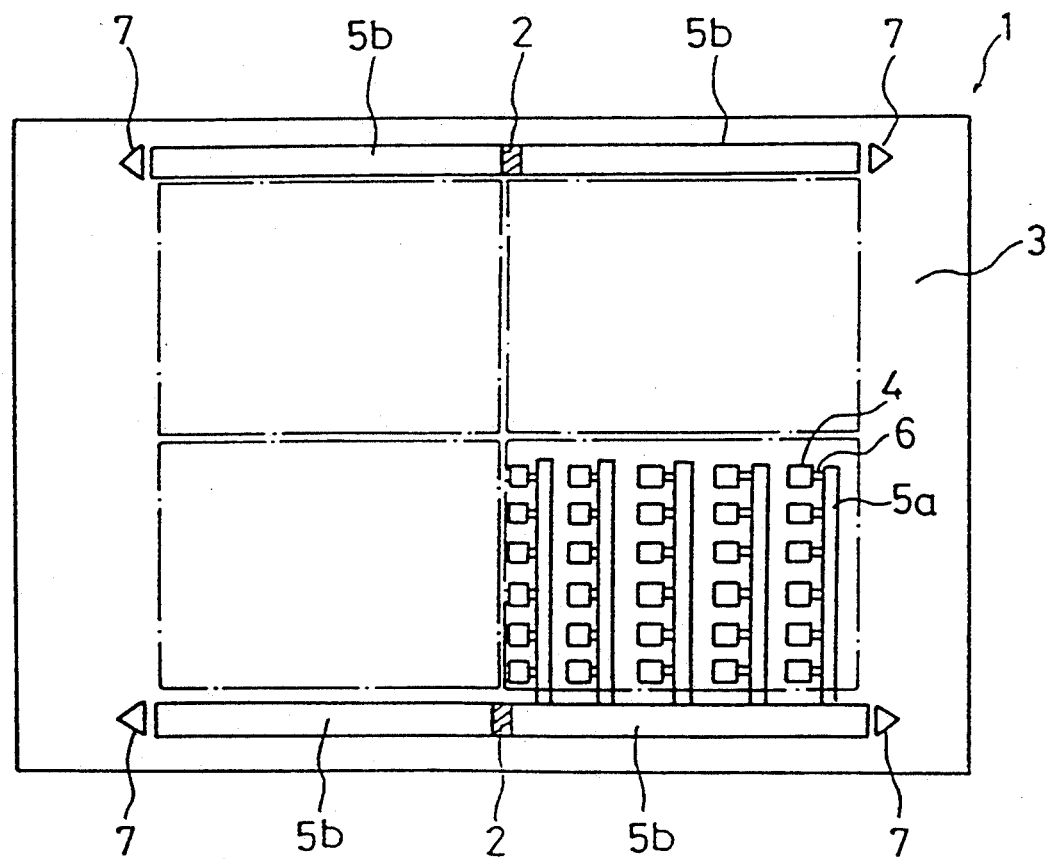
FIG. 5 is a plan view showing an alternative of the two-dimensional solid-state imaging device in accordance with the first, embodiment of the present invention.

FIG. 5 is a plan view showing another two-dimensional solid-state imaging device, in which two two-dimensional solid-state imaging devices as shown in FIG. 2 are symmetrically arranged on the semiconductor substrate 3. Also in this structure, when the charge input part 2 of the first embodiment is employed, all the light receiving elements 4 can be arranged at the same pitch, whereby the pattern production can be simplified and an uniform resolution can be obtained in the chip.

Figure 6:
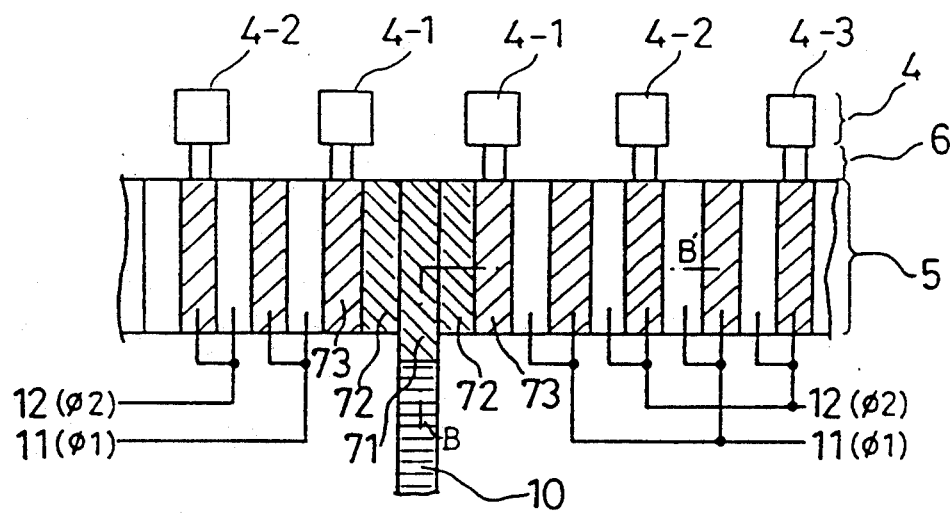
FIG. 6 is a plan view showing an input part of a one-dimensional solid-state imaging device in accordance with a second embodiment of the present invention.

FIG. 6 is a plan view showing a solid-state imaging device in accordance with a second embodiment of the present invention. In FIG. 6, the same reference numerals as those in FIG. 1 designate the same parts. A first charge input controlling gate 71 is serially connected with the charge input terminal 10. Second charge input controlling gates 72 are provided in contact with the first gate 71. The first and second gates 71 and 72 control the quantity of charges input from the charge input terminal 10. Common gates 73 are provided in contact with the second gates 72. The common gates 73 serve as third charge input controlling gates for transferring the charges measured in the first and second charge input controlling gates 71 and 72 in the charge input mode and serve as initial stage transfer electrodes for storing the signal charges from pixels for a time and thereafter transferring the same.

Figures 7A, 7B:
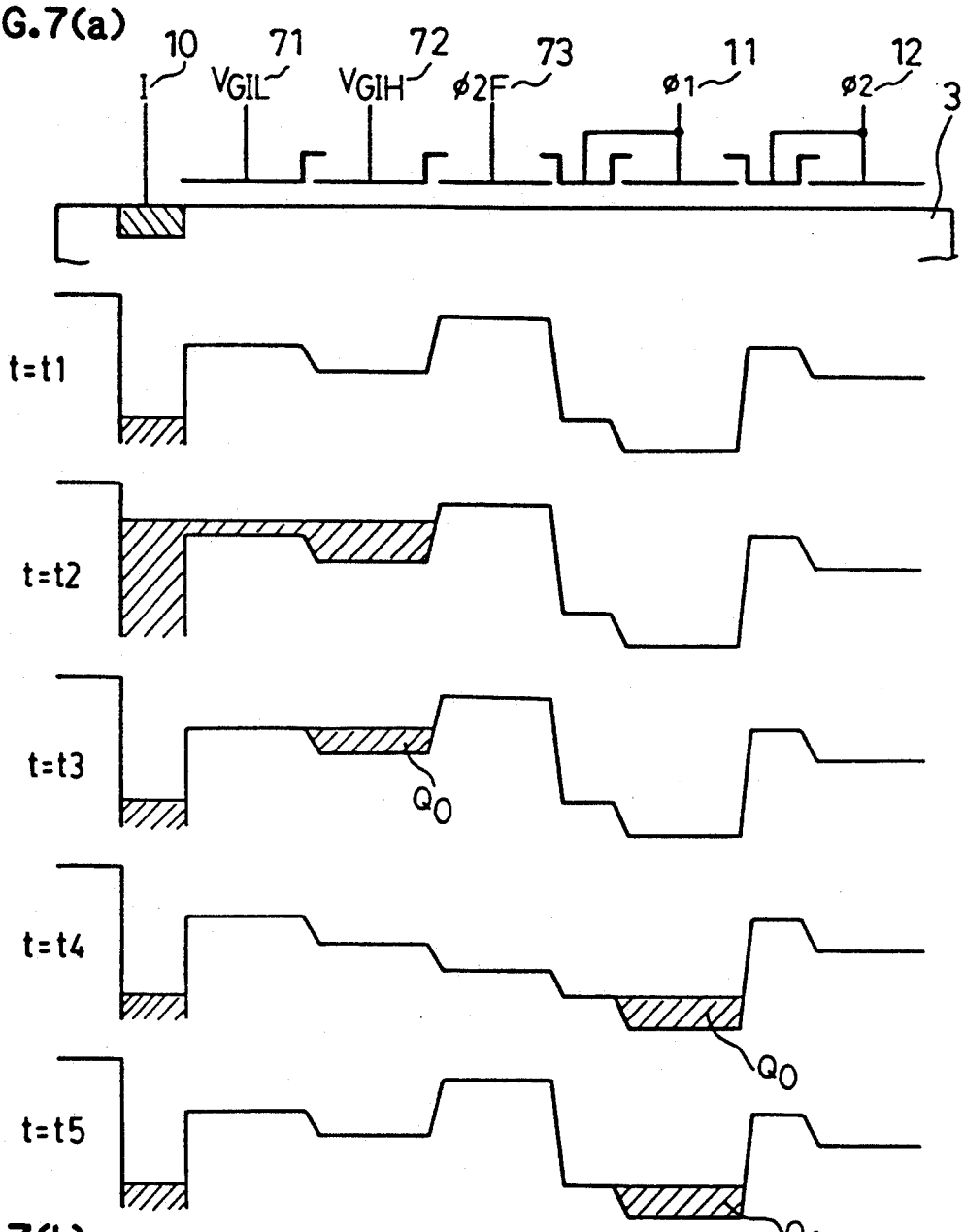
FIG. 7(a) is a diagram showing a cross-section taken along a line B—B' of FIG. 6 and potentials in the charge input mode and FIG. 7(b) is a diagram schematically showing waveforms of signals applied to the respective terminals.

Operation in the charge input mode will be described. FIG. 7(a) is a diagram showing a cross-section taken along a line B—B' of FIG. 6 and the potentials at times $t_1$ to $t_5$.

FIG. 7(b) shows waveforms of signals applied to the respective terminals.

Clock pulses I, $\phi 1$, $\phi 2$, $\phi 2F$ are applied to the charge input terminal 10, the transfer electrodes 11 and 12, and the common gate 73, respectively, while dc voltages $V_{GIL}$ and $V_{GIH}$ are applied to the charge input controlling gates 71 and 72.

At time $t_1$, signals of "H" level are applied to the charge input terminal 10 and the transfer electrode 11 while signals of "L" level are applied to the transfer electrode 12 and the signal input terminal of the common gate 73.

At time $t_2$, the level of the charge input terminal 10 is lowered and charges are transferred from the charge input terminal 10 to the potential well beneath the input controlling gates 71 and 72.

At time $t_3$, the charge input terminal 10 becomes "H" level again and the measured input charges $Q_0$ are stored only in the potential well beneath the input controlling gate 72.

At time $t_4$, the common gate 73 becomes "H" level and the charges $Q_0$ are transferred to the potential well beneath the CCD transfer electrode 11.

Operation in the imaging mode will be described.

Figure 8A:
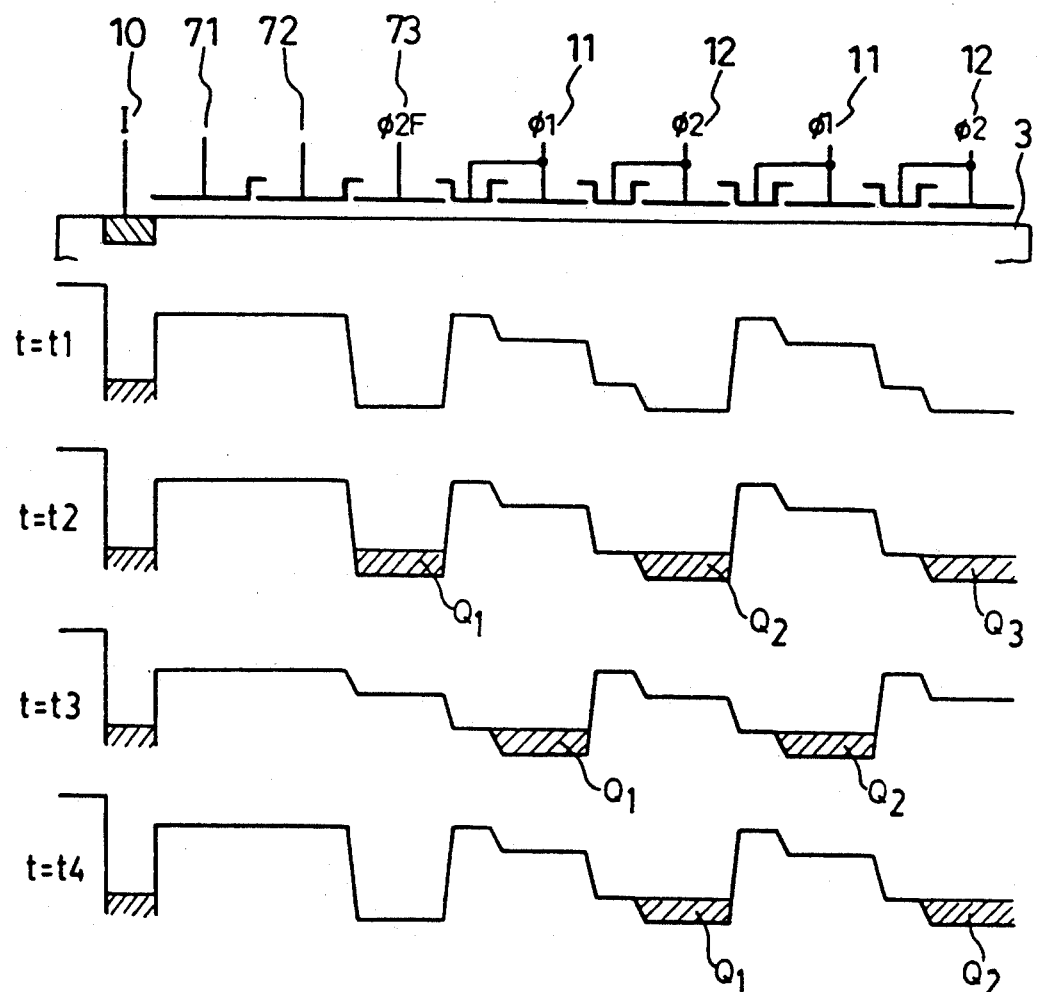
FIG. 8(a) is a diagram showing a cross-section taken along a line B—B' of FIG. 6 and potentials in the imaging mode and FIG. 8(b) is a diagram schematically showing waveforms of signals applied to the respective terminals.
Figure 8B:
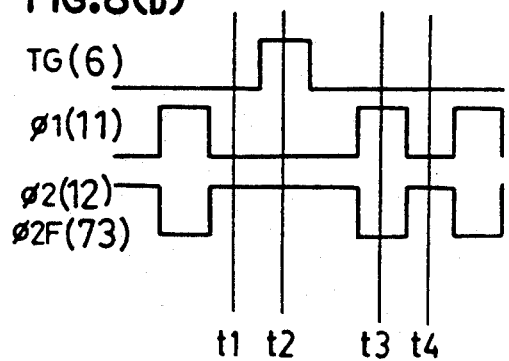

FIG. 8(a) is a diagram showing a cross-section taken along a line B—B' of FIG. 6 and the potentials at times $t_1$ to $t_4$. FIG. 8(b) shows waveforms of signals applied to the respective terminals.

A clock pulse having the same phase as that applied to the transfer electrode 12 is applied to the common gate 73 and dc voltages are applied to the charge input controlling gates 71 and 72.

Between times $t_1$ and $t_2$, the transfer gate TG is opened and the signal charges $Q_1$ and $Q_2$ stored in the light receiving elements 4-1 and 4-2 are transferred to the potential wells beneath the common electrode 73 and the transfer electrode 12, respectively.

At time $t_3$, the transfer electrode 12 and the common electrode 73 are set to "L" level and the transfer electrodes 11 are set to "H" level by applying clock pulses, whereby the signal charges $Q_1$ beneath the common electrode 73 are transferred to the potential well beneath the transfer electrode 11 and the signal charges $Q_2$ beneath the the transfer electrode 12 are transferred to the potential well beneath the transfer electrode 11 at the next stage.

At time $t_4$, the transfer electrodes 12 and the common electrode 73 become "H" level and the transfer electrodes 11 become "L" level, and the signal charges $Q_1$ and $Q_2$ beneath the transfer electrodes 11 are transferred to the potential wells beneath the transfer electrodes 12 at the next stage.

Thus, signal charges are transferred synchronously with clock pulses and successively, whereby charges generated in the light receiving elements 4 are read out. In this second embodiment, since the charge input terminal 10 is provided outside the CCDs 5, the area of the charge input part 2 can be equal to that of the first embodiment although the common gates 73 are added.

In this second embodiment, the pitch of the light receiving elements at the charge input part is as follows.

In case where the width of the transfer electrodes 11 and 12 is 8 microns and the interval between adjacent light receiving elements, other than those at the charge input part, is 16 microns, like the prior art device, by making the width of the charge input terminal 10 to 4 microns, the widths of the charge input controlling gates 71 and 72 3.5 microns and 5 microns, respectively, and the width of the common gate 73 5 microns, the interval between the light receiving elements 4-1 corresponding to the charge input part is 16 microns like the first embodiment. Thus, the pitch of the light receiving elements corresponding to the charge input part is equal to that of the light receiving elements corresponding to other parts of the imaging device. Also in this second embodiment, the CCD is provided with charge input means with keeping the pitch and the resolution uniform in the chip.

Now, consideration is given to the common gate. In the first embodiment of the present invention, in order to make the common gate 14 serve as the initial stage transfer electrode in the imaging mode and serve as the second charge input controlling gate in the charge input mode, it is necessary to apply a clock pulse to the common gate 14 during the imaging mode and a dc voltage during the charge input mode. Therefore, a clock pulse supply is always connected to the common gate 14 and when the dc voltage is applied to the common gate 14, a constant bias is generated using this clock pulse supply. Therefore, a capacitor for stabilizing the potential of the common gate 14 at the charge input time cannot be provided and a bias supply with high precision cannot be expected.

In the second embodiment, the third charge input controlling gate is added to the structure of the charge input part 2 of the first embodiment and the common gate 73 is driven only by clock pulse in the charge input mode and in the operating mode. Therefore, only dc voltage is always applied to the first and second charge input controlling gates 71 and 72, so that the charge input controlling gates 71 and 72 can be provided with a capacitor for stabilizing the potential thereof, resulting in a highly precise bias supply.

That is, in the second embodiment, switching of signals at the common gate is not required and a stable bias supply can be included in the charge input controlling gate in addition to the features of the first embodiment.

Figure 9A:
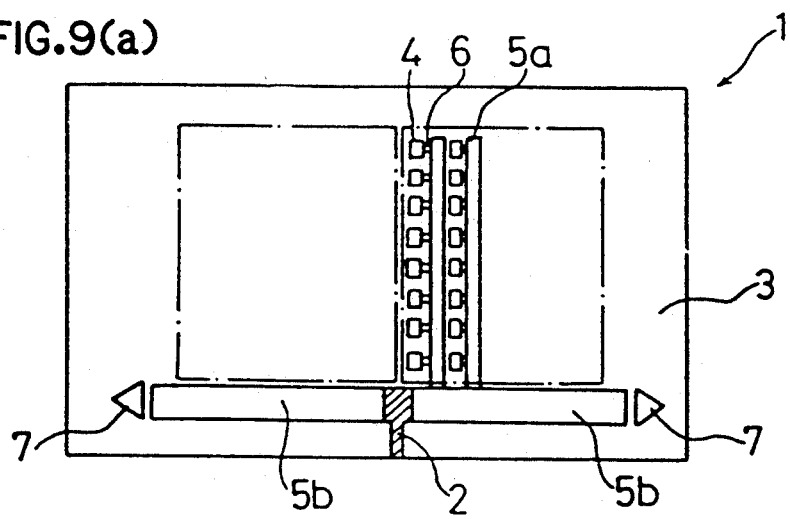
FIGS. 9(a) and 9(b) are plan views showing an input part of a two-dimensional solid-state imaging device in accordance with the second embodiment of the present invention.
Figure 9B:
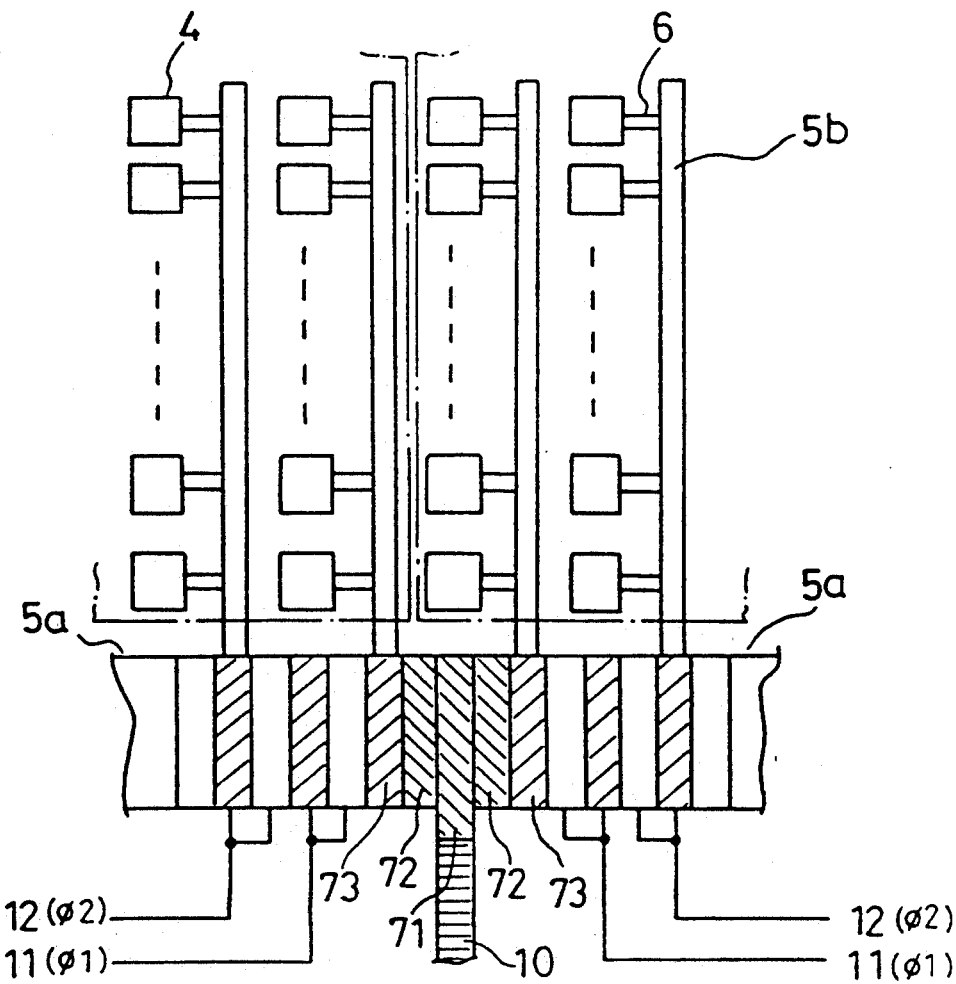
Figure 10:
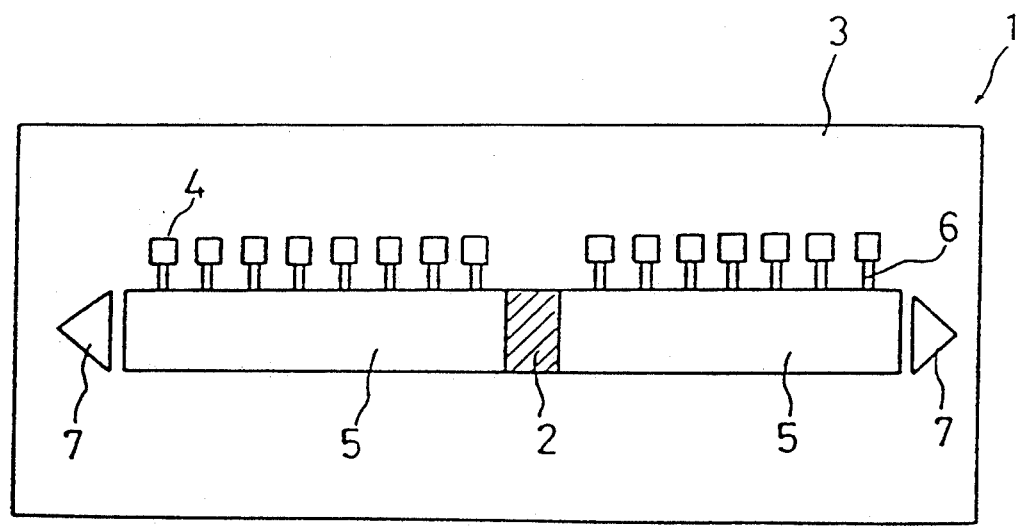
FIG. 10 is a plan view showing a one-dimensional solid-state imaging device in accordance with the prior art.
Figure 11:
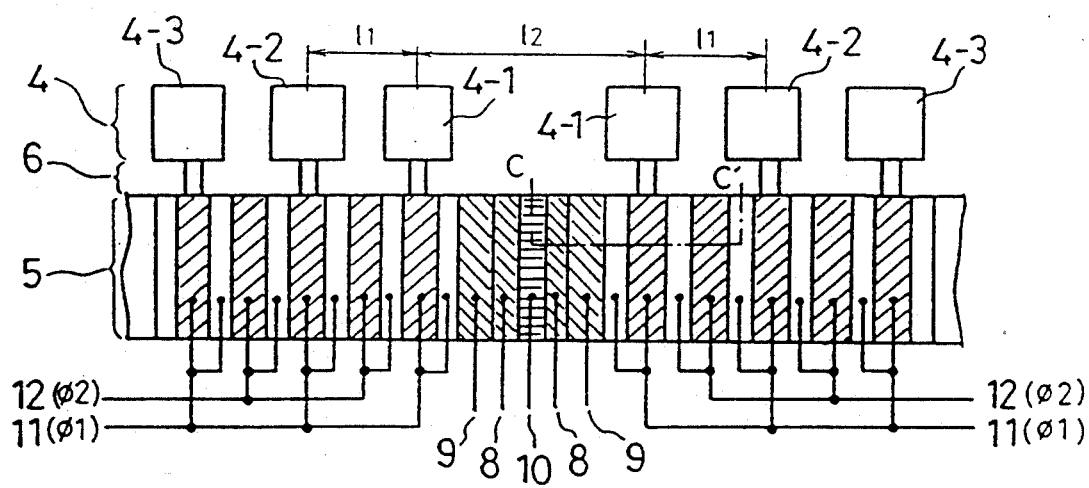
FIG. 11 is a plan view showing a charge input part of the device shown in FIG. 10.
Figure 12A:
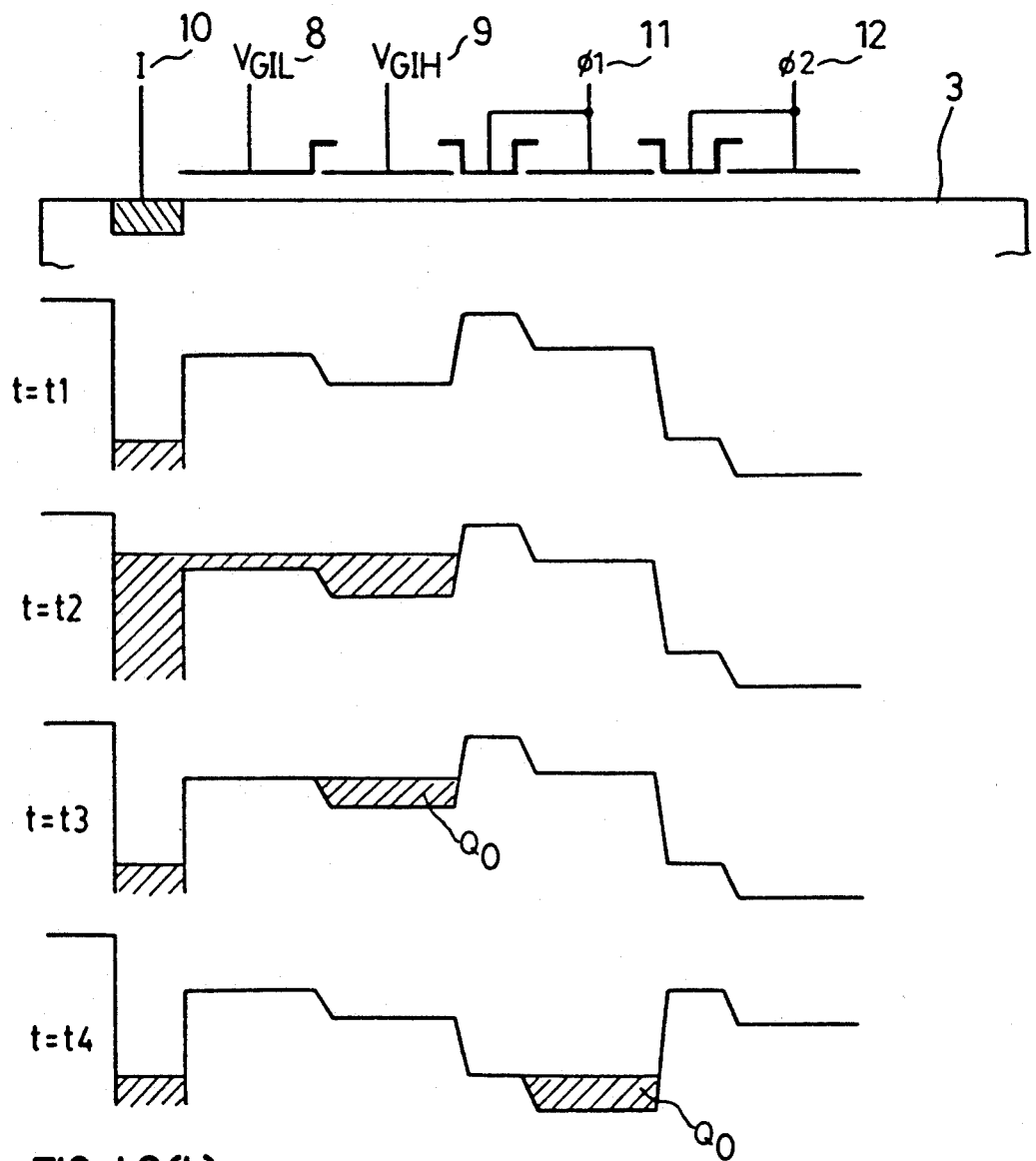
FIG. 12(a) is a diagram showing a cross-section taken along a line C—C' of FIG. 11 and potentials in the charge input mode and FIG. 12(b) is a diagram schematically showing waveforms of signals applied to the respective terminals.
Figure 12B:
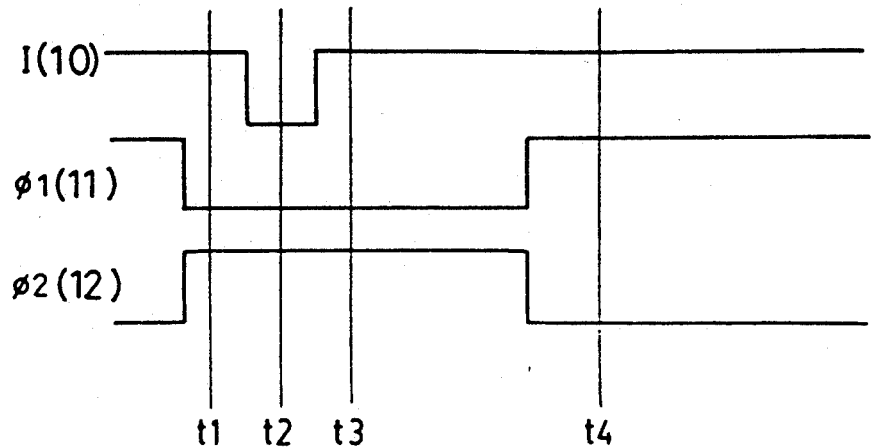
Figure 13A:
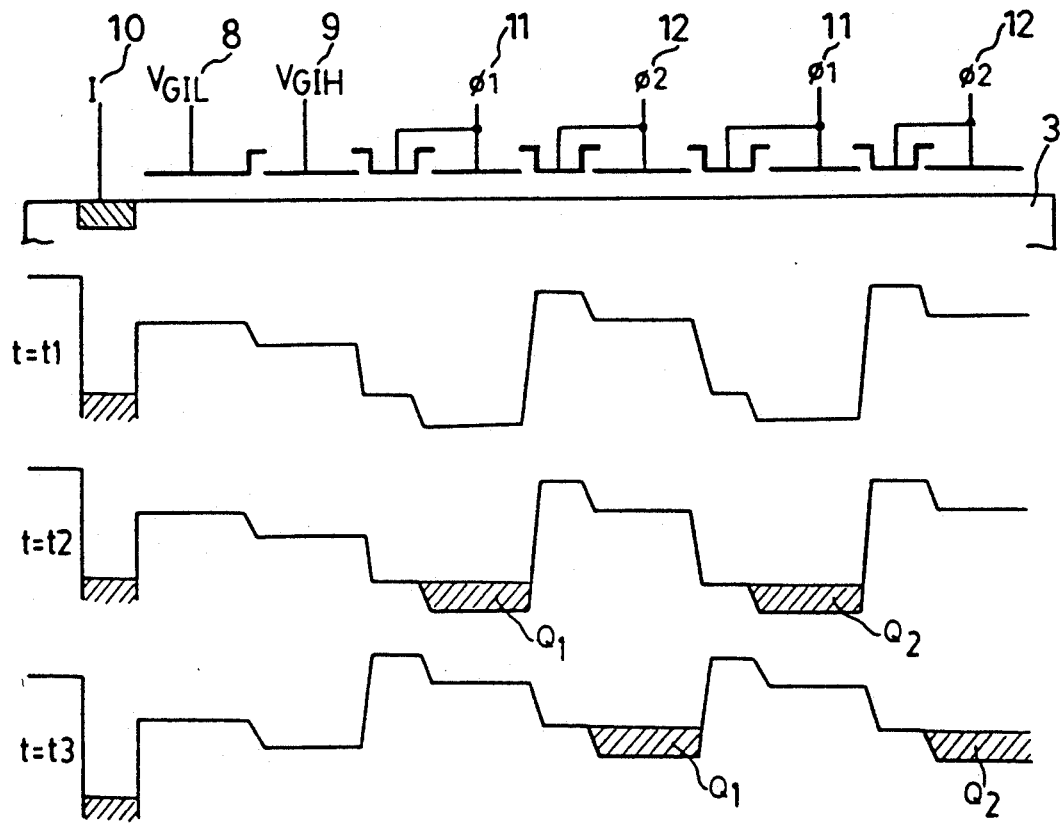
FIG. 13(a) is a diagram showing a cross-section taken along a line C—C' of FIG. 11 and potentials in the imaging mode and FIG. 13(b) is a diagram schematically showing waveforms of signals applied to the respective terminals.
Figure 13B:
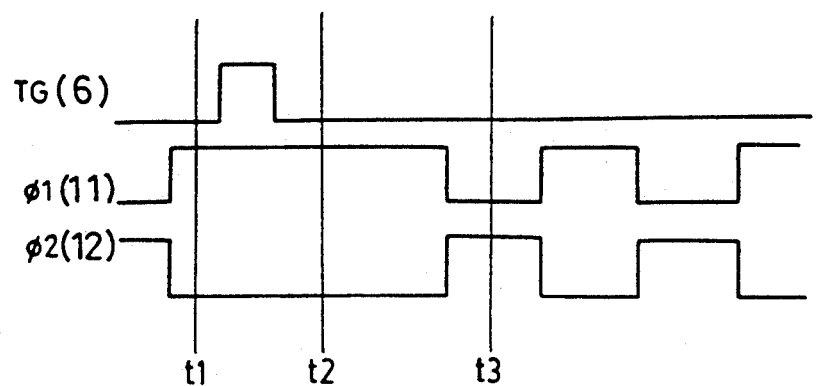

While in a embodiment the one-dimensional solid-state imaging device is described, the present invention can be also applied to a two-dimensional solid-state imaging device. FIG. 9(a) is a plan view showing a two-dimensional solid-state imaging device provided with the charge input part 2 of the second embodiment and FIG. 9(b) is a plan view showing the charge input part 2 in detail. Also in this case, the charge input means 2 can be provided at the initial stage of the horizontal CCD 5b using a design without a change in the pitch of the light receiving elements.

As is evident from the foregoing description, according to the present invention, a charge input means comprising a charge input source and a first and a second electrodes for controlling the quantity of the input charges is provided at the initial stage of the charge coupled device. The first electrode contacts the charge input source. The second electrode is arranged in contact with the first electrode and connected to the light receiving element via the transfer gate or another charge coupled device. In this structure, the second electrode serves as an electrode for controlling the quantity of the input charges in the charge input mode by applying a dc voltage thereto while it serves as an initial stage transfer electrode in the imaging mode by applying a clock pulse thereto. Therefore, the charge input means can be provided at the initial stage of the charge coupled device without changing the pitch of the light receiving elements. As a result, a high performance solid-state imaging device that can test the charge coupled device electrically during its operation while keeping the resolution uniform.

According to the present invention, a charge input means comprising a charge input source and first to a third electrodes for controlling the quantity of input charges is provided at the initial stage of the charge coupled device. The first electrode is arranged in contact with the charge input source and the second electrode is arranged in contact with the first electrode. The third electrode contacts the second electrode and is connected to the light receiving element via the transfer gate or another charge coupled device. In this structure, by applying a clock pulse to the third electrode continually, the third electrode serves as an electrode for transferring the measured charges in the charge input mode while it serves as an initial stage transfer electrode in the imaging mode. As a result, a high performance solid-state imaging device that can test the charged coupled device electrically during its operation while maintaining uniform resolution without changing the pitch of the light receiving elements at the charge input part is achieved.

What is claimed is:

1. A solid-state imaging apparatus comprising:
   a substrate;
   a charge input electrode disposed on the substrate for receiving electrical charges from an external source;
   first and second charge coupled devices disposed on the substrate on opposite sides of the charge input electrode, each charge coupled device including a plurality of pairs of alternating first and second charge transfer electrodes for transferring electrical charges in response to first and second charge transfer control signals applied to said first and second charge transfer electrodes, respectively;
   a plurality of photodiodes disposed in the substrate for converting incident light into electrical charges wherein the photodiodes are disposed in an array with a predetermined spacing interval between adjacent photodiodes;
   a plurality of charge transfer gates disposed on the substrate for controlling transfer of electrical charges from the photodiodes to the first charge transfer control electrodes, each of the charge transfer gate connecting a corresponding photodiodes to a respective first change transfer electrode; and
   first and second charge input control gates disposed on the substrate adjacent to and on opposite sides of the charge input electrode and adjacent to respective first charge transfer electrodes, those first charge transfer electrodes adjacent to the charge input control gates serving as charge transfer gates when the imaging apparatus is operating in a charge input mode testing the first and second charge coupled devices and charge transfer electrodes with electrical charges input through the charge input electrode, and as charge transfer electrodes when the imaging apparatus is operating in an imaging mode transferring electrical charges produced by the photodiodes in response to incident light, whereby the predetermined spacing interval between adjacent photodiodes is constant in the imaging apparatus including adjacent to the charge input electrode.

2. The solid-state imaging apparatus of claim 1 wherein the first and second charge coupled devices lie along a straight line.

3. The solid-state imaging apparatus of claim 2 including a plurality of third charge coupled devices disposed on the substrate, each of the third charge coupled devices being electrically connected to a corresponding first charge transfer electrode of one of the first and second charge coupled devices and including a plurality of charge transfer gates connecting the respective photodiodes and the corresponding third charge coupled device for controlling transfer of electrical charges from the photodiodes to the first charge transfer electrodes, each of the charge transfer gates connecting a corresponding photodiodes to one of the first charge transfer electrodes, the third charge coupled devices being disposed substantially perpendicular to the first and second charge coupled devices, thereby forming a two-dimensional imaging apparatus.

4. A solid-state imaging apparatus comprising:
   a substrate;

a charge input electrode disposed on the substrate for receiving electrical charges from an external source;

a charge input control gate disposed on the substrate and connected to the charge input electrode for controlling the flow of electrical charges supplied to the charge input electrode;

first and second charge coupled devices disposed on opposite sides of the charge input control gate, each charge coupled device including a plurality of pairs of alternating first and second charge transfer electrodes for transferring electrical charges in response to first and second charge transfer control signals applied to said first and second charge transfer electrodes, respectively;

a plurality of photodiodes disposed in the substrate for converting incident light into electrical charges wherein the photodiodes are disposed in an array with a predetermined spacing interval between adjacent photodiodes;

a plurality of charge transfer gates disposed on the substrate for controlling transfer of electrical charges from the photodiodes to the first charge transfer control electrodes, each of the charge transfer gates connecting a corresponding photodiodes to a respective first charge transfer electrode; and second and third charge input control gates disposed on the substrate adjacent to and on opposite sides of the first charge input control gate and adjacent to respective first charge transfer electrodes for controlling the transfer of electrical charges to those first charge transfer control electrodes adjacent to the second and third charge input control gates when the imaging apparatus is operating in a charge input mode testing the first and second charge coupled devices and charge transfer electrodes with electrical charges input through the charge input electrode, and for blocking the transfer of electrical charges input through the charge input electrode when the imaging apparatus is operating in an imaging mode transferring electrical charges produced by the photodiodes in response to incident light, whereby the predetermined spacing interval between adjacent photodiodes is constant in the imaging apparatus including adjacent to the charge input electrode and charge input control gate.

5. The solid-state imaging apparatus of claim 4 wherein the first and second charge coupled devices lie along a straight line.

6. The solid-state imaging apparatus of claim 5 including a plurality of third charge coupled devices disposed on the substrate, each of the third charge coupled devices being electrically connected to a corresponding first charge transfer electrode of one of the first and second charge coupled devices and including a plurality of charge transfer gates connecting the respective photodiodes and the corresponding third charge coupled device for controlling transfer of electrical charges from the photodiodes to the first charge transfer electrodes, each of the charge transfer gates connecting a corresponding photodiodes to one of the first charge transfer electrodes, the third charge coupled device being disposed substantially perpendicular to the first and second charge coupled device, thereby forming a two-dimensional imaging apparatus.

* * * * *

UNITED STATES PATENT AND TRADEMARK OFFICE
CERTIFICATE OF CORRECTION

PATENT NO. : 5,249,055

DATED : September 28, 1993

INVENTOR(S) : Masuda et al

It is certified that error appears in the above-identified patent and that said Letters Patent is hereby corrected as shown below:

The title page showing the illustrative figure should be deleted to be replaced with the attached title page.

Substitute the attached Figure 1 for Figures 1 (a) and 1 (b).

United States Patent [19]

Masuda et al.

[11] Patent Number: 5,249,055
[45] Date of Patent: Sep. 28, 1993

[54] SOLID-STATE IMAGING APPARATUS INCLUDING EXTERNAL CHARGE INPUT TERMINAL

[75] Inventors: Takeshi Masuda; Kiyotaka Yashiro; Yoshio Tange; Yuji Miyachi, all of Tokyo; Tadashi Shiraishi, Itami, all of Japan

[73] Assignees: National Space Development Agency of Japan; Mitsubishi Denki Kabushiki Kaisha, both of Tokyo, Japan

[21] Appl. No.: 798,964

[22] Filed: Nov. 27, 1991

[30] Foreign Application Priority Data

Nov. 29, 1990 [JP] Japan .................. 2-336257

[51] Int. Cl.⁵ .................................... H04N 5/335
[52] U.S. Cl. ........................ 358/213.28; 358/213.11; 358/213.23
[58] Field of Search ............... 358/213.23, 213.26, 358/213.28, 213.11; 357/24 LR

[56] References Cited

U.S. PATENT DOCUMENTS

| | | | |
|---|---|---|---|
| 4,093.872 | 6/1978 | Hartman | 357/24 LR |
| 4,583,003 | 4/1986 | Kimata | 250/578 |
| 4,647,977 | 3/1987 | Tower | 358/213 |
| 4,788,592 | 11/1988 | Yamawaki et al. | 358/213.29 |
| 4,896,340 | 1/1990 | Caro | 377/60 |
| 5,063,449 | 11/1991 | Shibata et al. | 358/213.11 |

FOREIGN PATENT DOCUMENTS

54-8428 4/1979 Japan .
58-130564 8/1983 Japan .

*Primary Examiner*—Michael T. Razavi
*Assistant Examiner*—Tuan V. Ho
*Attorney, Agent, or Firm*—Leydig, Voit & Mayer

[57] ABSTRACT

A solid-state imaging device includes a plurality of light receiving elements, transfer gates for controlling reading-out of signal charges generated by the light receiving elements, a charge coupled device for transferring the signal charges from the light receiving elements through the transfer gates, a charge input electrode, and first and second electrodes for controlling the quantity of charges input from the charge input source. The first electrode contacts the charge input source. The second electrode contacts the first electrode and is connected to a light receiving element via a transfer gate or another charge coupled device. In this structure, the second electrode controls the quantity of input charges in response to a dc voltage in a charge input mode for testing the images and serves as a first stage transfer electrode in response to a clock pulse in a imaging mode for forming an image. Thus, the pitch of the light receiving elements is constant even at the charge input electrode.

6 Claims, 13 Drawing Sheets

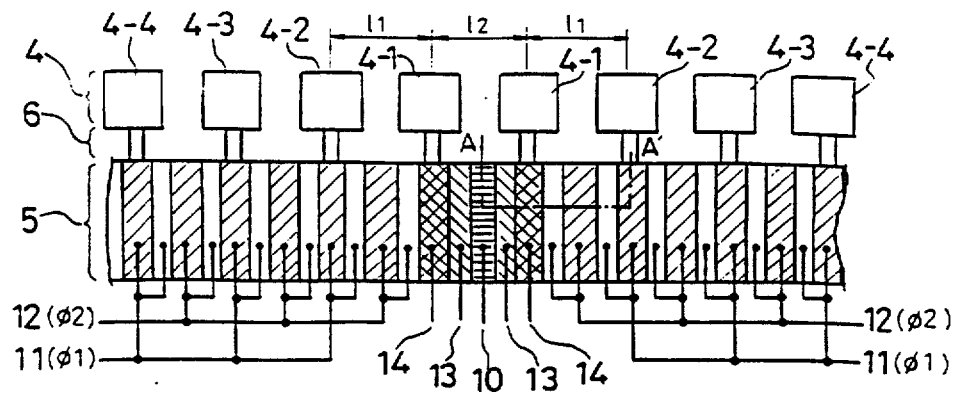

UNITED STATES PATENT AND TRADEMARK OFFICE
CERTIFICATE OF CORRECTION

PATENT NO. : 5,249,055
DATED : September 28, 1993
INVENTOR(S) : Masuda, et al

It is certified that error appears in the above-indentified patent and that said Letters Patent is hereby corrected as shown below:

Claim 1, column 10, line 27, change "gate" to --gates--;
Claim 1, column 10, lines 27-28, change "photodiodes" to --photodiode--;
Claim 1, column 10, line 28, change "change" to --charge--;
Claim 3, column 10, line 62, change "photodiodes" to --photodiode--;
Claim 4, column 11, lines 25-26, change "photodiodes" to --photodiode--;
Claim 6, column 12, line 30, change "device" to --devices--;
Claim 6, column 12, line 32, change "device" to --devices--.

Signed and Sealed this

Twenty-eight Day of March, 1995

Attest:

BRUCE LEHMAN

Attesting Officer         Commissioner of Patents and Trademarks